United States Patent
Wu et al.

(10) Patent No.: US 8,605,442 B2
(45) Date of Patent: Dec. 10, 2013

(54) SERVER CABINET AND SERVER STRUCTURE USING THE SAME

(75) Inventors: Hung-Yi Wu, New Taipei (TW); Xiao-Zhu Chen, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 300 days.

(21) Appl. No.: 13/182,650

(22) Filed: Jul. 14, 2011

(65) Prior Publication Data

US 2012/0092828 A1 Apr. 19, 2012

(30) Foreign Application Priority Data

Oct. 18, 2010 (CN) .......................... 2010 1 0510101

(51) Int. Cl.
*H05K 7/16* (2006.01)

(52) U.S. Cl.
USPC ........................................... 361/727; 211/26

(58) Field of Classification Search
USPC .......................................... 361/727; 211/26
See application file for complete search history.

(56) References Cited

U.S. PATENT DOCUMENTS

| | | | | |
|---|---|---|---|---|
| 5,460,441 | A * | 10/1995 | Hastings et al. | 312/298 |
| 6,021,047 | A * | 2/2000 | Lopez et al. | 361/727 |
| 6,201,702 | B1 * | 3/2001 | Schmitt | 361/725 |
| 6,373,695 | B1 * | 4/2002 | Cheng | 361/679.39 |
| 6,560,114 | B2 * | 5/2003 | Berry et al. | 361/727 |
| 6,739,682 | B2 * | 5/2004 | Shih | 312/334.4 |
| 6,891,727 | B2 * | 5/2005 | Dittus et al. | 361/724 |
| 6,930,886 | B2 * | 8/2005 | Velez et al. | 361/727 |
| 7,301,756 | B2 * | 11/2007 | Wayman | 361/679.01 |
| 7,400,509 | B2 * | 7/2008 | Hidaka | 361/727 |
| 7,454,113 | B2 * | 11/2008 | Barnes | 385/135 |
| 7,529,097 | B2 * | 5/2009 | Coglitore et al. | 361/725 |
| 7,929,279 | B2 * | 4/2011 | Liu | 361/679.02 |
| 8,369,087 | B2 * | 2/2013 | Wu et al. | 361/679.58 |
| 8,405,983 | B2 * | 3/2013 | Chen | 361/690 |
| 2002/0093795 | A1 * | 7/2002 | Gough et al. | 361/727 |
| 2004/0129657 | A1 * | 7/2004 | Dean et al. | 211/26 |
| 2006/0274508 | A1 * | 12/2006 | LaRiviere et al. | 361/727 |
| 2009/0219701 | A1 * | 9/2009 | Wu et al. | 361/727 |

\* cited by examiner

*Primary Examiner* — Lisa Lea Edmonds
(74) *Attorney, Agent, or Firm* — Altis Law Group, Inc.

(57) ABSTRACT

A server structure is disclosed including a server cabinet, spaced fixing units, and server groups. Each server unit includes a first server unit and a second server unit fixed to supporting frames of the server cabinet by first fixing plates and the second fixing plates of the fixing units, respectively. The first server unit alternately abuts the second server unit, and the stacked height of each first server unit and the abutting second server unit is equivalent to the height along the supporting frame occupied by the corresponding fixing unit.

19 Claims, 4 Drawing Sheets

SERVER CABINET AND SERVER STRUCTURE USING THE SAME

BACKGROUND

1. Technical Field

The present disclosure relates to a server structure and a server cabinet incorporated in the server structure.

2. Description of the Related Art

Server structures typically include a server cabinet and a plurality of server units fixed inside the server cabinet. The server cabinet often defines two opposite pairs of vertical supporting frames. Each supporting frame defines a plurality of fixing holes vertically spaced apart from each other. Each three adjacent fixing holes may be defined as a group of the fixing holes. The groups of fixing holes are for fixing the server units on the supporting frames. The server unit usually has a thickness of 2U or 4U (U is defined as 4.445 centimeter). Each two adjacent server units are arranged to engage with each group of fixing holes to be defined as a server group. When being fixed, each two adjacent server groups have no gap therebetween. The arrangement of the fixing holes can get each two adjacent server groups having 1.5U thickness fixed. However, there are gaps between each two adjacent server units, and accordingly space of the server cabinet is wasted.

Therefore, there is room for improvement within the art.

BRIEF DESCRIPTION OF THE DRAWINGS

Many aspects of the present server structure and the server cabinet can be better understood with reference to the following drawings. The components in the drawings are not necessarily drawn to scale, the emphasis instead being placed upon clearly illustrating the principles of the present server structure and the server cabinet. Moreover, in the drawings, like reference numerals designate corresponding parts throughout the several views.

DETAILED DESCRIPTION

Figure 1:
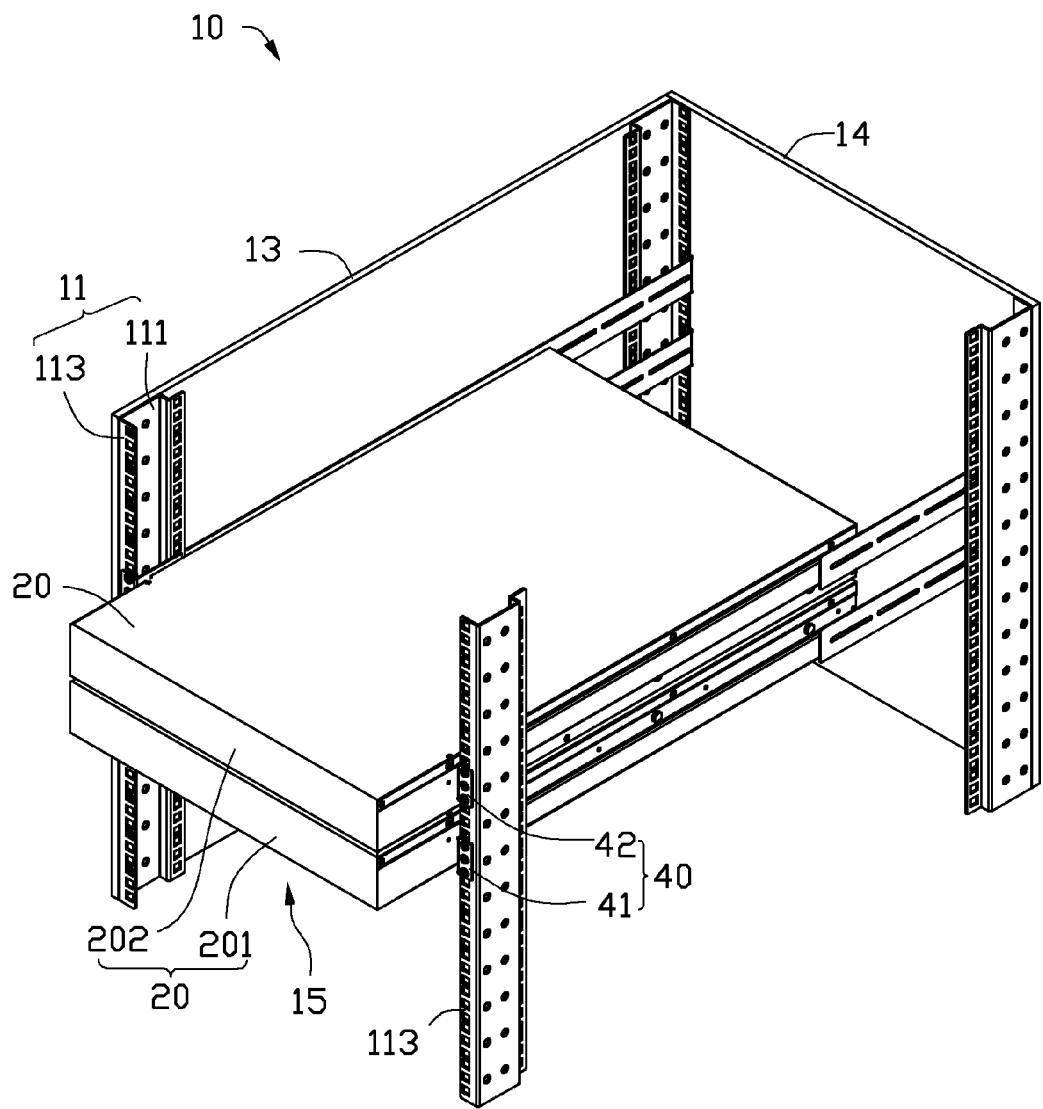
FIG. 1 shows an isometric view of an assembled server structure according to an exemplary embodiment.

FIG. 1 shows an exemplary server structure including a server cabinet 10, server groups 20 fixed inside the server cabinet 10, and a plurality of fixing units 40 corresponding to the server groups 20. Each group of server units 20 includes a first server unit 201 and a second server unit 202. Each fixing unit 40 includes a first fixing plate 41 and a second fixing plate 42. The first server unit 201 and the second server unit 202 generally have the same structure. Two pairs of interior rails 30 are provided for fixing the first server unit 201 and the second server unit 202 to the first fixing plate 41 and the second fixing plate 42, respectively.

The server cabinet 10 includes two pairs of opposite vertical supporting frames 11, two opposite side boards 13, a rear board 14 and a front entry opening 15. The rear board 14 connects two side boards 13. The entry opening 15 is defined between two supporting frames 11.

FIG. 1 further shows each of the supporting frames 11 including a frame body 111 and an extending wall 113. The extending wall 113 perpendicularly connects to the frame body 111. The two extending walls 113 of the opposite supporting frames 11 are spaced-apart. Each extending wall 113 vertically defines a plurality of fixing holes 115. In this embodiment, each three vertically adjacent fixing holes 115 wholly occupy a first height referred as D that is equated to 1U (1U is defined as 4.445 centimeter). Each two abutting first height Ds have minor gaps therebetween and may be omitted in this embodiment. The first fixing plate 41 and the second fixing plate 42 can be of the height D, and accordingly fix to and overlap the three adjacent fixing holes 115. The first fixing plate 41 and the second fixing plate 42 may form exterior rails (not shown) for engaging with the interior rails 30. The first fixing plate 41 and the second fixing plate 42 can be fixed to the supporting frames 11 with an interval of the first height D, accordingly each fixing unit 40 occupies a height of 3D referred as second height L (equivalent to 3D).

Figure 2:
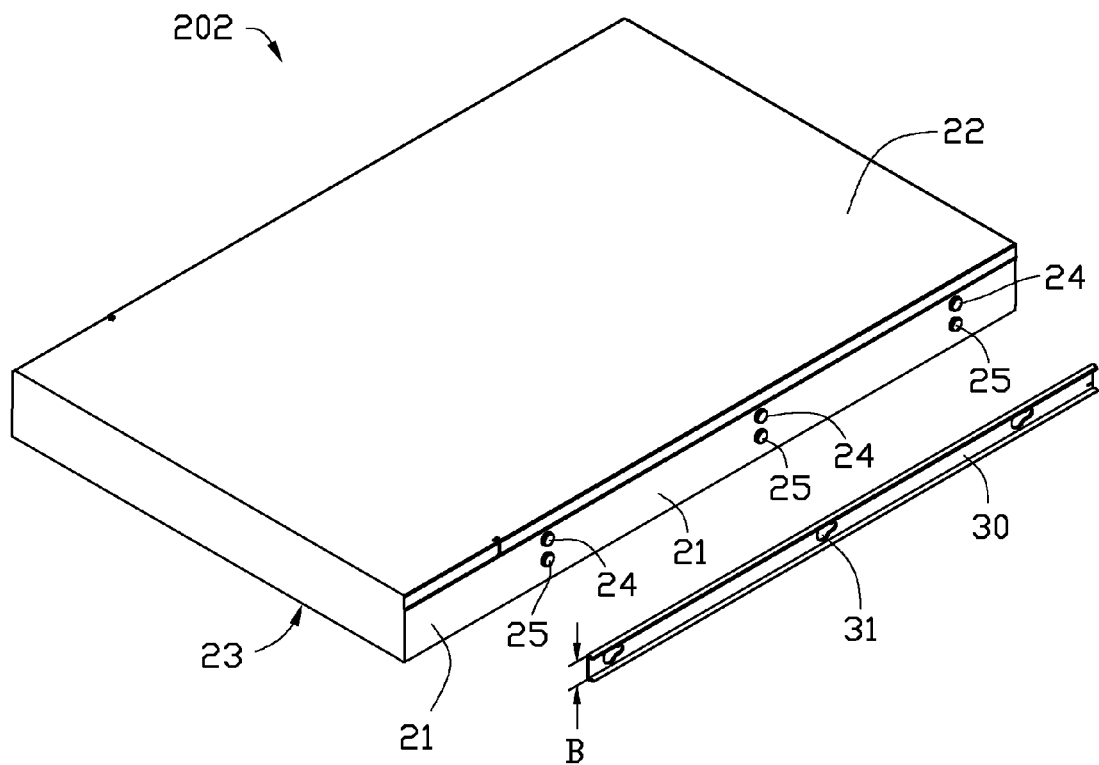
FIG. 2 shows an isometric view of a second server unit and an interior rail shown in FIG. 1.

FIG. 2 further shows the first server unit 201 and the second server unit 202 each having a height of 1.5D. The first server unit 201 and the second server unit 202 have the same structure and each includes two opposite sidewalls 21, a first wall 22 and a second wall 23. The sidewall 21 has a height of 1.5D. Each sidewall 21 forms a first latching unit 24 and a second latching unit 25 below and parallel with the first latching unit 24. The first latching unit 24 and the second latching unit 25 have the same structure and each is formed by a plurality of evenly spaced and lined screws. The first latching unit 24 is closer to the first wall 22, and the second latching unit 25 is closer to the second wall 23.

Figure 3:
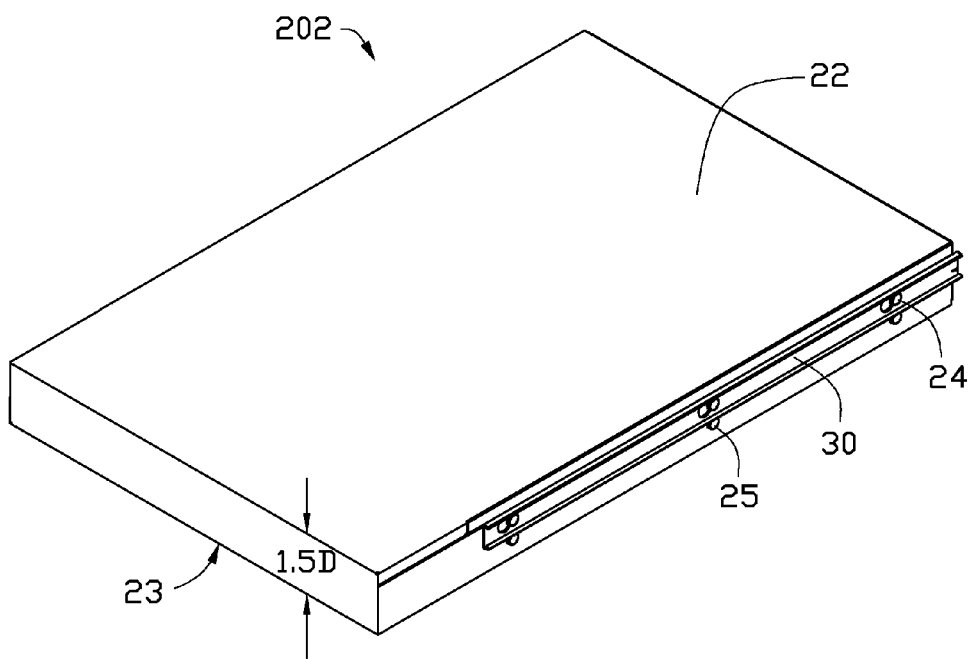
FIG. 3 shows an assembled view of the second server unit and the interior rail shown in FIG. 2.

Referring also to FIG. 3, the interior rail 30 has a width referred to as B. The interior rail 30 defines a plurality of latching holes 31 corresponding to the first latching unit 24 and the second latching unit 25. The latching holes 31 can latch with one of the first latching unit 24 and the second latching unit 25, and thus the interior rail 30 can latch to the first latching unit 24 or the second latching unit 25. Since the first latching unit 24 is defined as a vertical interval 0.5B to the second latching unit 25, the first latching unit 24 or the second latching unit 25 when latched are located at the middle of the interior rail 30.

Figure 4:
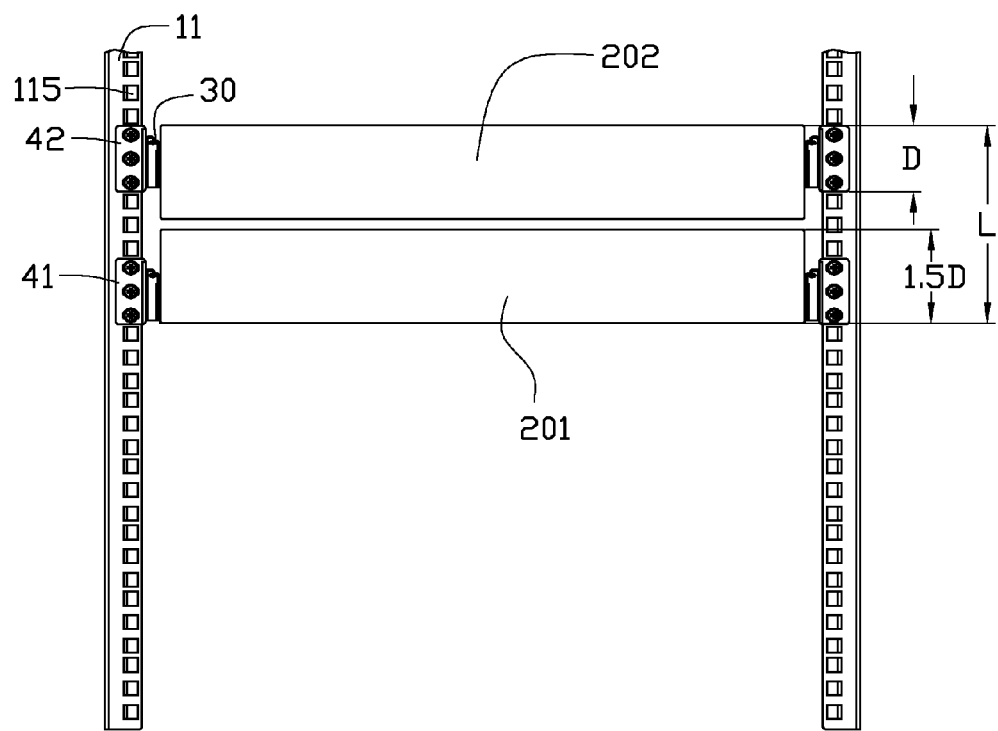
FIG. 4 shows a front view of the server structure shown in FIG. 1.

Referring again to FIG. 3, to assemble the first server unit 201 into the server cabinet 10, one of the two interior rails 30 can be latched to the second latching unit 25 of the first server unit 201. The interior rail 30 engages with the exterior rail of the first fixing plate 41. The other interior rail 30 can be latched to the first latching unit 24 of the second server unit 202. The second server unit 202 is positioned above the first server unit 201, and the other interior rail 30 engages with the exterior rail (not shown) of the second fixing plate 42. At this position, the height of the first server unit 201 is approximately 1.5D, including the height of the first fixing plate 41 (1D) and the vertical interval height between the first fixing plate 41 and the second fixing plate 42 (approximate 0.5D). The height of the second server unit 202 is approximately 1.5D, including the height of the second fixing plate 42 (1D) and the interval between the first fixing plate 41 and the second fixing plate 42 (approximate 0.5D, show in FIG. 4). In other words, after assembly, the first server unit 201 and the second server unit 202 are stacked with a height of 3D equivalent to the second height L, almost using up the space enclosed by the first fixing plate 41 and the second fixing plate 42 and greatly increasing the space consuming efficiency of the server cabinet 10.

It is to be understood that even though numerous characteristics and advantages of the present embodiments have been set forth in the foregoing description, together with details of assemblies and functions of various embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A server cabinet, comprising:
   two pairs of supporting frames;
   a plurality of spaced fixing units assembled to the server cabinet, each of which comprising a first fixing plate and a second fixing plate, the first fixing plates and the second fixing plates alternately fixed to the supporting frames, each adjacent first fixing plate and second fixing plate spaced from each other;
   wherein when a server group, comprising first and second server units are installed in the cabinet, the first server unit and the second server unit are fixed to the supporting frames by the first fixing plates and the second fixing plates, respectively, the first server units alternately abutting the second server unit, the stacked height of each first server unit and the abutting second server unit being equivalent to the height along the supporting frame occupied by the corresponding fixing unit; each of the first server unit and the second server unit form a first latching unit and a second latching unit vertically spaced from the first latching unit, the first latching unit of the second server unit latching the second server unit, the second latching unit of the first server unit latching the first server unit.

2. The server cabinet as claimed in claim 1, wherein each of the first server unit and the second server unit define an interior rail for latching the first latching unit and the second latching unit, respectively.

3. The server cabinet as claimed in claim 2, wherein each of the first server unit and the second server unit comprises a sidewall, the first latching unit and the second latching unit are formed on the sidewalls, respectively, the first latching unit is closer to the first wall, and the second latching unit is closer to the second wall.

4. The server cabinet as claimed in claim 2, wherein each of the interior rail defines a plurality of latching holes, the plurality of the latching holes latch the first latching unit or the second latching unit, the first latching unit or the second latching unit when latched are located at the middle of the interior rail.

5. The server cabinet as claimed in claim 4, wherein the interior rail has a width of B, the interval between the first latching unit and the second latching unit is 0.5B.

6. The server cabinet as claimed in claim 1, wherein each of the supporting frames defines a plurality of fixing holes, each three fixing holes wholly occupy a first height referred as D, the first fixing plate in combination with the second fixing plate is of the first height D, and fix to and overlap the three adjacent fixing holes.

7. The server cabinet as claimed in claim 6, wherein the first fixing plate and the second fixing plate are fixed to the supporting frame with an interval of the first height D, each fixing unit occupies a height of 3D referred as second height L, and L is equivalent to 3D.

8. The server cabinet as claimed in claim 7, wherein the first server unit and the second server unit each has a height of 1.5D, the first server unit and the second server unit are stacked with a height of 3D equivalent to the second height L.

9. A server structure, comprising:
   a server cabinet comprising two pairs of supporting frames;
   a plurality of spaced fixing units assembled to the server cabinet, each of which comprising a first fixing plate and a second fixing plate, the first fixing plates and the second fixing plates alternately fixed to the supporting frames, each adjacent first fixing plate and second fixing plate spaced from each other;
   server groups, each of which comprising a first server unit and a second server unit, the first server units and the second server units fixed to the supporting frames by the first fixing plates and the second fixing plates, respectively, the first server units alternately abutting the second server unit, the stacked height of each first server unit and the abutting second server unit being equivalent to the height along the supporting frame occupied by the corresponding fixing unit; each of the first server unit and the second server unit form a first latching unit and a second latching unit vertically spaced from the first latching unit, the first latching unit of the second server unit latching the second server unit, the second latching unit of the first server unit latching the first server unit.

10. The server structure as claimed in claim 9, wherein each of the first server unit and the second server unit define an interior rail for latching the first latching unit and the second latching unit, respectively.

11. The server structure as claimed in claim 10, wherein each of the first server unit and the second server unit comprises a sidewall, the first latching unit and the second latching unit are formed on the sidewalls, respectively, the first latching unit is closer to the first wall, and the second latching unit is closer to the second wall.

12. The server structure as claimed in claim 10, wherein each of the interior rail defines a plurality of latching holes, the plurality of the latching holes latch the first latching unit or the second latching unit, the first latching unit or the second latching unit when latched are located at the middle of the interior rail.

13. The server structure as claimed in claim 12, wherein the interior rail has a width of B, the interval between the first latching unit and the second latching unit is 0.5B.

14. The server structure as claimed in claim 9, wherein each of the supporting frames defines a plurality of fixing holes, each three fixing holes wholly occupy a first height referred as D, the first fixing plate in combination with the second fixing plate is of the first height D, and fix to and overlap the three adjacent fixing holes.

15. The server structure as claimed in claim 14, wherein the first fixing plate and the second fixing plate are fixed to the supporting frame with an interval of the first height D, each fixing unit occupies a height of 3D referred as second height L, and L is equivalent to 3D.

16. The server structure as claimed in claim 15, wherein the first server unit and the second server unit each has a height of 1.5D, the first server unit and the second server unit are stacked with a height of 3D equivalent to the second height L.

17. A server cabinet, comprising:
   two pairs of supporting frames;
   a plurality of spaced fixing units assembled to the server cabinet, each of which comprising a first fixing plate and a second fixing plate, the first fixing plates and the second fixing plates alternately fixed to the supporting frames, each adjacent first fixing plate and second fixing plate spaced from each other;
   wherein each of the supporting frames defines a plurality of fixing holes, each three fixing holes wholly occupy a first height referred as D, the first fixing plate in combination with the second fixing plate is of the first height D, and fix to and overlap the three adjacent fixing holes, when a server group, comprising first and second server units are installed in the cabinet, the first server unit and the second server unit are fixed to the supporting frames by the first fixing plates and the second fixing plates, respectively, the first server units alternately abutting the second server unit, the stacked height of each first server unit and the abutting second server unit being equivalent to the height along the supporting frame occupied by the corresponding fixing unit.

18. The server cabinet as claimed in claim 17, wherein the first fixing plate and the second fixing plate are fixed to the supporting frame with an interval of the first height D, each fixing unit occupies a height of 3D referred as second height L, and L is equivalent to 3D.

19. The server cabinet as claimed in claim 18, wherein the first server unit and the second server unit each has a height of 1.5D, the first server unit and the second server unit are stacked with a height of 3D equivalent to the second height L.

* * * * *